(12) United States Patent
Han et al.

(10) Patent No.: US 10,446,506 B2
(45) Date of Patent: Oct. 15, 2019

(54) WAFER LEVEL PACKAGE AND MANUFACTURING METHOD THEREOF

(71) Applicant: WISOL CO., LTD., Osan-si, Gyeonggi-do (KR)

(72) Inventors: Jung Hoon Han, Osan-si (KR); Eun Tae Park, Osan-si (KR); Jin Ho Ha, Osan-si (KR); Jun Woo Yong, Osan-si (KR)

(73) Assignee: WISOL CO., LTD., Osan-si, Gyeonggi-Do (KR)

( * ) Notice: Subject to any disclaimer, the term of this patent is extended or adjusted under 35 U.S.C. 154(b) by 0 days.

(21) Appl. No.: 15/992,359

(22) Filed: May 30, 2018

(65) Prior Publication Data

US 2018/0358308 A1 Dec. 13, 2018

(30) Foreign Application Priority Data

Jun. 8, 2017 (KR) ........................ 10-2017-0071855

(51) Int. Cl.
| | |
|---|---|
| *H01L 23/52* | (2006.01) |
| *H01L 23/00* | (2006.01) |
| *H01L 21/768* | (2006.01) |
| *H01L 23/10* | (2006.01) |
| *H03H 3/02* | (2006.01) |
| *H03H 3/08* | (2006.01) |
| *H03H 9/10* | (2006.01) |

(52) U.S. Cl.
CPC ...... *H01L 23/564* (2013.01); *H01L 21/76877* (2013.01); *H01L 23/10* (2013.01); *H01L 24/09* (2013.01); *H01L 24/33* (2013.01); *H01L 24/83* (2013.01); *H01L 2224/83051* (2013.01); *H01L 2924/0105* (2013.01); *H01L 2924/01029* (2013.01); *H01L 2924/01079* (2013.01); *H03H 3/02* (2013.01); *H03H 3/08* (2013.01); *H03H 9/1007* (2013.01); *H03H 9/1064* (2013.01)

(58) Field of Classification Search
CPC . H01L 21/76877; H01L 23/10; H01L 23/564; H01L 24/09; H01L 24/33; H01L 24/83
USPC .......................................................... 257/690
See application file for complete search history.

(56) References Cited

U.S. PATENT DOCUMENTS

| | | | | |
|---|---|---|---|---|
| 7,061,099 B2 * | 6/2006 | Lu | ....................... | B81C 1/00269 |
| | | | | 257/704 |
| 7,378,922 B2 * | 5/2008 | Kubo | .................. | B81C 1/00238 |
| | | | | 333/133 |
| 7,380,698 B2 * | 6/2008 | Meyer | .................. | B23K 1/0012 |
| | | | | 228/194 |

(Continued)

*Primary Examiner* — Luan C Thai
(74) *Attorney, Agent, or Firm* — LRK Patent Law Firm

(57) ABSTRACT

A wafer level package includes a substrate including bonding pads and a first protection dam and having a plurality of circuit pattern units disposed on a side; a printed circuit board having a plurality of connection pads, a second protection dam and via holes disposed thereon; and a connection unit connected to some of the plurality of connection pads and the second protection dam disposed on the printed circuit board. Freedom of design can be improved through the wafer level package and the manufacturing method thereof, and reliability of the wafer level package can be improved. The manufacturing process can be simplified as the bridge process is omitted when wiring is designed, and the size of an element may be reduced.

17 Claims, 5 Drawing Sheets

(56) References Cited

U.S. PATENT DOCUMENTS

| | | | |
|---|---|---|---|
| 7,456,497 B2* | 11/2008 | Higashi | B81B 7/007 257/678 |
| 7,486,160 B2* | 2/2009 | Tsuda | H03H 3/08 333/187 |
| 7,576,426 B2* | 8/2009 | Gan | B81C 1/00269 257/710 |
| 2018/0234076 A1* | 8/2018 | Ando | H03H 9/1014 |

* cited by examiner

WAFER LEVEL PACKAGE AND MANUFACTURING METHOD THEREOF

CROSS REFERENCE TO RELATED APPLICATION

The present application claims priority to Korean Patent Application No. 10-2017-0071855, filed in the Korean Intellectual Property Office on Jun. 8, 2017, the entire content of which is incorporated herein by reference.

BACKGROUND OF THE INVENTION

1. Field of the Invention

The present invention relates to a wafer level package and a manufacturing method thereof.

2. Description of Related Art

Among the electronic components, there are chips that should have a predetermined empty inner space, i.e., an air cavity of a predetermined space, such as a Surface Acoustic Wave (SAW) filter, a Temperature Compensation Crystal Oscillator (TCXO), a Film Bulk Acoustic Resonator (FBAR) filter and the like.

The SAW filter is a filter for filtering high frequency using the frequency transfer characteristic of transferring frequency along the surface using a piezoelectric material, in which the surface should be secured as an air cavity for frequency transfer, and an inner specific area of a component having a thin film structure, such as a TXCO, a FBAR and the like, also should be formed as an air cavity.

These chips are manufactured in the form of a wafer level package (WLP) when the chips are manufactured as a package, and the inner space thereof is implemented in the form of a package completely insulated from the outside to prevent generation of a critical failure by blocking infiltration of contaminants, such as moisture or the like, from the outside.

Such a semiconductor device package is generally configured of a piezoelectric substrate formed with a circuit pattern including a bonding pad, and a cap adhered on the surface of the piezoelectric substrate by an adhesive to protect the circuit pattern from the external environment and to secure an air cavity of a predetermined space.

At this point, if the difference between the Coefficient Thermal Expansion (CTE) values of the piezoelectric substrate and the cap is large, the package may be broken due to different expansion rates, and thus the piezoelectric substrate and the cap are generally configured of the same material and have transparency to pass through ultraviolet rays or laser beams.

The piezoelectric substrate and the cap of a wafer level package are configured of the same material, and when the piezoelectric substrate and the cap are configured in a wafer, there is a problem in that it is difficult to form a via.

SUMMARY OF THE INVENTION

An object of the present invention is to provide a wafer level package improving freedom of design of a device.

A wafer level package according to the present invention may include a substrate including bonding pads and a first protection dam and having a plurality of circuit pattern units disposed on a side; a printed circuit board having a plurality of connection pads, a second protection dam and via holes disposed thereon; and a connection unit connected to some of the plurality of connection pads and the second protection dam disposed on the printed circuit board.

In addition, the connection pads connected to the second protection dam through the connection unit may be a ground pad.

In addition, the connection pads and the second protection dam may be disposed on the printed circuit board at positions corresponding to the bonding pads and the first protection dam disposed on the substrate.

In addition, a pad may be disposed on a side of the printed circuit board.

In addition, the pad may be a pad for SMT.

In addition, the connection pads may be implemented as a single layer or multiple layers of conductive materials.

In addition, the protection dams may be implemented using materials and a structure the same as those of the connection pads.

In addition, when the bonding pads and the connection pads, and the first protection dam and the second protection dam are attached, an overall structure may be Cu—Sn—Cu or Au—Sn—Au.

In addition, if the overall structure is Cu—Sn—Cu when the bonding pads and the connection pads, and the first protection dam and the second protection dam are attached, the connection pads and the second protection dam may be configured as a Cu single layer structure if the bonding pads and the first protection dam are a Cu—Sn stack structure, and the connection pads and the second protection dam may be configured as an Sn—Cu stack structure if the bonding pads and the first protection dam are a Cu single layer structure.

In addition, if the overall structure is Au—Sn—Au when the bonding pads and the connection pads, and the first protection dam and the second protection dam are attached, the connection pads and the second protection dam may be configured as an Au single layer structure if the bonding pads and the first protection dam are an Au—Sn stack structure, and the connection pads and the second protection dam may be configured as an Sn—Au stack structure if the bonding pads and the first protection dam are an Au single layer structure.

In addition, the printed circuit board may be configured of three thin copper layers.

In addition, via holes passing through an insulation layer of the printed circuit board may be formed at positions corresponding to the bonding pads.

A method of manufacturing a wafer level package according to the present invention may include the steps of: disposing circuit pattern units on a substrate; disposing bonding pads and a first protection dam on a side of the substrate; disposing connection pads and a second protection dam on a side of a second insulation layer of a printed circuit board; forming a second circuit pattern layer on the other side of the second insulation layer; forming via holes passing through the second insulation layer from the connection pads and being connected to the second circuit pattern layer; disposing a connection unit for connecting the second protection dam and some of the connection pads; disposing a first insulation layer on the other side of the second insulation layer; disposing a first circuit pattern layer and a pad on a side of the first insulation layer; forming via holes passing through the first insulation layer from the first circuit pattern layer and being connected to the second circuit pattern layer; filling inside of the via holes; and attaching the substrate and the printed circuit board.

In addition, the connection pads connected to the second protection dam through the connection unit may be a ground pad.

In addition, the connection pads and the second protection dam of the printed circuit board may be disposed at positions corresponding to the bonding pads and the first protection dam disposed on the substrate.

In addition, at the step of disposing connection pads and a second protection dam on a printed circuit board, the connection pads may be implemented as a single layer or multiple layers of conductive materials.

In addition, the second protection dam may be implemented using conductive materials and a structure the same as those of the connection pads.

In addition, the pad may be a pad for SMT.

In addition, at the step of attaching the substrate and the printed circuit board, the bonding pads and the connection pads, and the first protection dam and the second protection dam may be attached, and an overall structure when they are attached may be Cu—Sn—Cu or Au—Sn—Au.

In addition, if the overall structure is Cu—Sn—Cu when the bonding pads and the connection pads, and the first protection dam and the second protection dam are attached, the connection pads and the second protection dam may be configured as a Cu single layer structure if the bonding pads and the first protection dam are a Cu—Sn stack structure, and the connection pads and the second protection dam may be configured as an Sn—Cu stack structure if the bonding pads and the first protection dam are a Cu single layer structure.

In addition, if the overall structure is Au—Sn—Au when the bonding pads and the connection pads, and the first protection dam and the second protection dam are attached, the connection pads and the second protection dam may be configured as an Au single layer structure if the bonding pads and the first protection dam are an Au—Sn stack structure, and the connection pads and the second protection dam may be configured as an Sn—Au stack structure if the bonding pads and the first protection dam are an Au single layer structure.

DETAILED DESCRIPTION OF THE PREFERRED EMBODIMENT

Details of the objects and technical configuration of the present invention described above and operational effects according thereto will be further clearly understood by the detailed description hereinafter. In the description of the present invention, if a substrate, a layer (film), a region, a pattern or a structure is referred to as being formed or disposed "up/on" or "down/under" another substrate, layer (film), region, pad or pattern, it can be "directly" formed or disposed or "indirectly" formed or disposed with the intervention of other layers. Classification of "up/on" or "down/under" of each layer is defined on the basis of drawings.

The terms such as first, second, etc. used hereinafter are merely identification symbols for distinguishing the same or corresponding elements, and the same or corresponding elements are not limited by the terms such as first, second, etc.

Singular expressions include plural expressions, unless the context clearly indicates otherwise. The terms such as "include", "have" and the like may be interpreted as addition of features, numbers, steps, operations, elements, components or a combination of these stated in the specification.

Hereinafter, the present invention will be described in detail with reference to the accompanying drawings.

Figure 1:
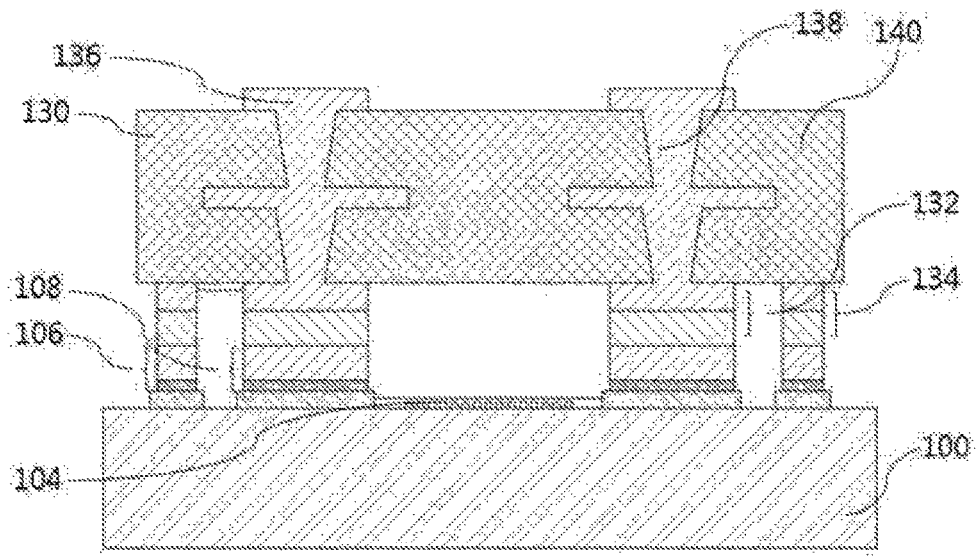
FIG. 1 is a cross-sectional view showing a wafer level package according to the present invention.

FIG. 1 is a cross-sectional view showing a wafer level package according to an embodiment of the present invention.

As shown in FIG. 1, a wafer level package according to the present invention may include a substrate 100 and a printed circuit board 140.

The substrate 100 may include a circuit pattern unit 104, bonding pads 108 and a first protection dam 106.

Although the substrate 100 may be one of a LiTaO3 wafer, a LiNbO3 wafer and a silicon wafer, it is not limited thereto.

A plurality of circuit pattern units 104 may be disposed on a side of the substrate 100. The circuit pattern unit 104 may be an Inter Digital Transducer (IDT) electrode unit. The circuit pattern unit 104 may be formed without restriction if a conductive material is used, and for example, although the circuit pattern unit 104 may be implemented using a material having excellent electrical characteristics, such as copper (Cu), silver (Ag), palladium (Pd), aluminum (Al), nickel (Ni), titanium (Ti), gold (Au), platinum (Pt) or the like, it is not limited thereto.

Although the circuit pattern unit 104 may be implemented in a method such as Additive, Subtractive, semi-Additive or the like, it is not limited thereto.

The bonding pads 108 may be disposed on a side of the substrate 100 to be spaced apart from the circuit pattern unit 104.

The bonding pads 108 are configured of conductive materials, and although the bonding pads 108 may be implemented using materials having excellent electrical characteristics, such as copper (Cu), silver (Ag), palladium (Pd), aluminum (Al), nickel (Ni), titanium (Ti), gold (Au), platinum (Pt), tin (Sn) and the like, it is not limited thereto.

The bonding pads 108 may have a single layer or stacked structure configured of conductive materials.

The first protection dam 106 may be disposed along the edge of the substrate 100 to be spaced apart from the bonding pads 108.

The first protection dam 106 is configured of conductive materials, and although the first protection dam 106 may be implemented using materials having excellent electrical characteristics, such as copper (Cu), silver (Ag), palladium (Pd), aluminum (Al), nickel (Ni), titanium (Ti), gold (Au), platinum (Pt), tin (Sn) and the like, it is not limited thereto.

The first protection dam 106 may have a single layer or stacked structure configured of conductive materials.

The first protection dam 106 may be implemented using conductive materials and a structure the same as those of the bonding pads 108.

Although the bonding pad 108 and the first protection dam 106 may be formed in a plating method, an evaporation method, a sputtering method or the like, it is not limited thereto.

The wafer level package according to the present invention may be implemented by attaching or bonding the substrate 100 and the printed circuit board 140.

The printed circuit board 140 configuring the wafer level package will be described in detail with reference to FIG. 2.

Figure 2:
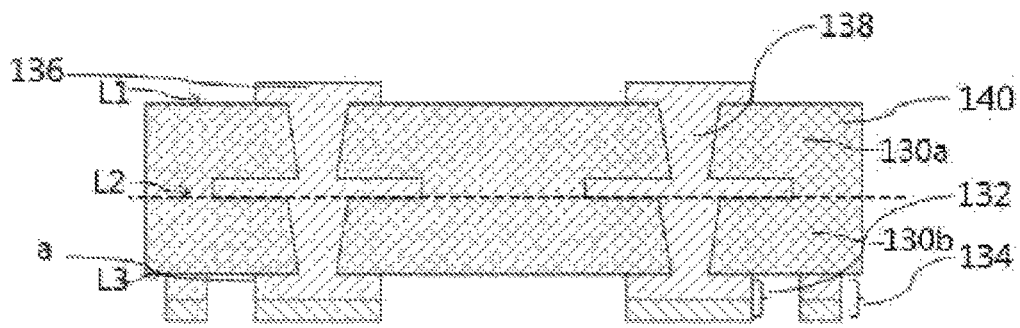
FIG. 2 is a cross-sectional view showing a printed circuit board of a wafer level package according to the present invention.

FIG. 2 is a cross-sectional view showing a printed circuit board 140 configuring a wafer level package according to an embodiment of the present invention. As shown in FIG. 2, a printed circuit board 140 configuring a wafer level package according to the present invention may include an insulation layer 130, three thin copper layers, connection pads 132, a second protection dam 134 and a connection unit 'a'.

The insulation layer 130 may include a first insulation layer 130a and a second insulation layer 130b.

The thin copper layer may include a first thin copper layer L1, a second thin copper layer L2 and a third thin copper layer L3.

A plurality of connection pads 132 and a second protection dam 134 may be disposed on a side of the printed circuit board 140 at the positions corresponding to the bonding pads 108 and the first protection dam 106.

The connection pads 132 and the second protection dam 134 disposed on the printed circuit board 140 may be attached to the bonding pads 108 and the first protection dam 106 disposed on the substrate 100.

The connection pads 132 are configured of conductive materials, and although the connection pads 132 may be implemented using materials having excellent electrical characteristics, such as copper (Cu), silver (Ag), palladium (Pd), aluminum (Al), nickel (Ni), titanium (Ti), gold (Au), platinum (Pt), tin (Sn) and the like, it is not limited thereto.

The second protection dam 134 is configured of conductive materials, and although the second protection dam 134 may be implemented using materials having excellent electrical characteristics, such as copper (Cu), silver (Ag), palladium (Pd), aluminum (Al), nickel (Ni), titanium (Ti), gold (Au), platinum (Pt), tin (Sn) and the like, it is not limited thereto.

The second protection dam 134 may block inflow of moisture and contaminants.

Although the second protection dam 134 may be implemented using conductive materials and a structure the same as those of the connection pads 132, it is not limited thereto.

One or more insulation layers 130 may be implemented, and although a case of implementing two insulation layers is described in the present invention as an example, it is not limited thereto.

The insulation layer 130 may include a first insulation layer 130a and a second insulation layer 130b.

The first insulation layer 130a and the second insulation layer 130b may include thermosetting resin such as epoxy resin and thermoplastic resin such as polyimide. The first insulation layer 130a may further include a reinforcing material in addition to the resin. Although the reinforcing material may be a fabric, a reinforcing material, an inorganic filler or the like, it is not limited thereto. The fabric reinforcing material may be a glass fiber and may be formed as a prepreg as the glass fiber is impregnated with the resin.

A first circuit pattern layer (not shown) may be formed on a side of the first insulation layer 130a.

The second insulation layer 130b may be stacked on the other side of the first insulation layer 130a. That is, the second insulation layer 130b may be stacked on a side opposite to a side including the first circuit pattern layer (not shown).

A second circuit pattern layer 'c' may be formed on a side of the second insulation layer 130b.

Thickness of the first insulation layer 130a may be different from that of the second insulation layer 130b. The second insulation layer 130b may thicker than the first insulation layer 130a. The first insulation layer 130a only needs to be as thick as to dispose the first circuit pattern layer (not shown) thereon.

After the insulation layer 130 is stacked, via holes 138 may be formed. That is, after the first insulation layer 130a and the second insulation layer 130b are stacked, via holes 138 passing through the first insulation layer 130a and the second insulation layer 130b may be disposed. Electrical connection may be achieved through the via holes 138.

The via holes 138 may be formed in the insulation layer 130 not to pass through the circuit pattern on a side using a YAG laser or a CO2 laser. That is, the via holes 138 are formed leaving the circuit pattern formed on a side.

The via holes 138 may be a structure stacked across all the layers including the first insulation layer 130a and the second insulation layer 130b.

Although the via holes 138 may be formed in any one of processing methods including a mechanical process, a laser process and a chemical process, it is not limited thereto.

When the via holes 138 are formed by mechanical drilling, the cross-sections of the via holes 138 may be uniform.

A process using a laser is preferable if the size of the via holes 138 is less than 100 um, and if the via holes 138 are formed through laser processing, the top surface of the via holes 138 may be different from the bottom surface in size. An Yttrium Aluminum Garnet (YAG), a CO2 laser or an ultraviolet (UV) laser is preferably used as the laser processing drill.

Although via holes 138 formed through laser processing are described as an example in the present invention, it is not limited thereto.

Inside of the via holes 138 is filled with a conductive material, and although the method of filling a conductive material includes a plating method, a conductive paste filling method and the like, it is not limited thereto.

A pad 136 may be formed on the top of the first thin copper layer L1, and the pad 136 may be an SMT pad 136 for Surface Mount Technology (SMT).

The Surface Mount Technology (SMT) is a technique of mounting and soldering surface mount devices on the surface of a printed circuit board, which is a method of mounting semiconductors, diodes, chips and the like on the printed circuit board using a plurality of pieces of equipment and sintering the components, and the components may be disposed on both sides of the printed circuit board.

The second circuit pattern layer 'c' may be disposed on the top of the second thin copper layer L2, and although the second circuit pattern layer 'c' may be configured as a copper (Cu) layer, it is not limited thereto.

The circuit pattern may be formed in an Additive process, a Subtractive Process, a Modified Semi Additive Process (MSAP), a Semi Additive Process (SAP) or the like of a printed circuit board manufacturing process.

The first circuit pattern layer and the second circuit pattern layer 'c' may be electrically connected through the via holes 138.

A protection dam 134 and a plurality of connection pads 132 may be disposed on the other side of the third thin copper layer L3. The second protection dam 134 is formed along the edge of the printed circuit board 140 and may block inflow of moisture and contaminants.

The connection pads 132 are formed at the positions corresponding to the bonding pads 108 of the substrate 100.

Some of the plurality of connection pads 132 may include a connection unit 'a' connected to the second protection dam 134. Some of the connection pads 132 connected to the second protection dam 134 may be a ground pad GND.

Figure 3:
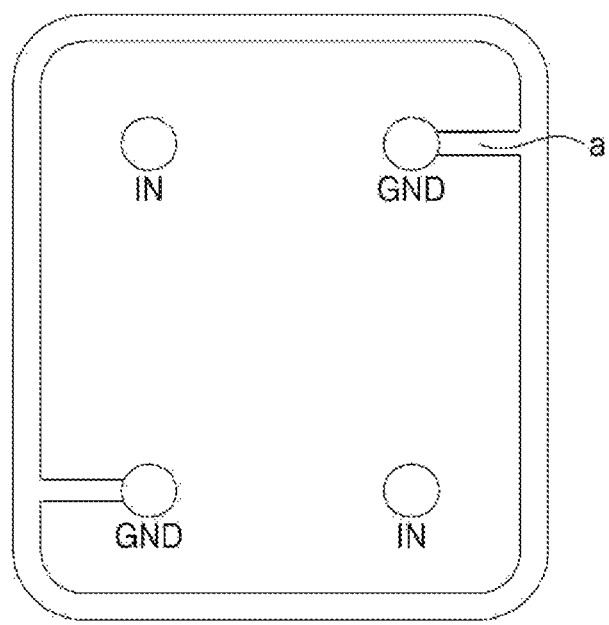
FIG. 3 is a plan view schematically showing L3 configuring a printed circuit board.

FIG. 3 is a plan view schematically showing the third thin copper layer L3. As shown in FIG. 3, some of the plurality of connection pads 132 may include a connection unit 'a' connected to the second protection dam 134.

The connection pads 132 connected to the second protection dam 134 through the connection unit 'a' may be a ground pad GND.

The connection unit 'a' may be configured of a Cu single layer, an Sn single layer, a Cu/Sn dual layer or the like and may be implemented through an electroless or electroplating method.

Since the ground GND area is increased through the connection unit 'a', reliability of the wafer level package can be improved.

The substrate 100 and the printed circuit board 140 may be bonded through TLP bonding, and when the TLP bonding is conducted, the bonding pads 108 and the first protection dam 106 disposed on the substrate 100 may be attached to the connection pads 132 and the second protection dam 134 disposed on the printed circuit board 140.

The connection pads 132 and the protection dam 134 of the printed circuit board 140 may be a Cu single layer structure if the bonding pads 108 of the substrate 100 are a Cu—Sn stack structure, and the connection pads 132 and the second protection dam 134 of the printed circuit board 140 may be an Sn—Cu stack structure if the bonding pads 108 of the substrate 100 are a Cu single layer structure.

When the bonding pads 108 and the first protection dam 106 of the substrate 100 are bonded to the connection pads 132 and the second protection dam 134 of the printed circuit board 140, it may have a Cu—Sn—Cu structure overall. When the bonding pads 108 and the connection pads 132, and the first protection dam 106 and the second protection dam 134 are attached, it may have a Cu—Sn—Cu or Au—Sn—Au structure overall.

When the connection pads 132 and the bonding pads 108, and the second protection dam 134 and the first protection dam 106 are attached to have a Cu—Sn—Cu structure overall, the bonding pads 108 and the first protection dam 106 may be configured as a Cu single layer structure if the connection pads 132 and the second protection dam 134 are a Cu—Sn stack structure, and the bonding pads 108 and the first protection dam 106 may be configured as an Sn—Cu stack structure if the connection pads 132 and the second protection dam 134 are a Cu single layer structure.

When the connection pads 132 and the bonding pads 108, and the second protection dam 134 and the first protection dam 106 are attached to have an Au—Sn—Au structure overall, the bonding pads 108 and the first protection dam 106 may be configured as an Au single layer structure if the connection pads 132 and the second protection dam 134 are an Au—Sn stack structure, and the bonding pads 108 and the first protection dam 106 may be configured as an Sn—Au stack structure if the connection pads 132 and the second protection dam 134 are an Au single layer structure.

The wafer level package like this may be formed as any one of SAW filter, TCXO and FBAR, and when the wafer level package is formed as a SAW filter, the circuit pattern converts the electrical signal into a surface acoustic wave and filters the surface acoustic wave, or converts the surface acoustic wave into an electrical signal having a frequency of a predetermined band, and transfers the electrical signal to an external device through the connection pad and 132 the via hole 138.

Figure 4:
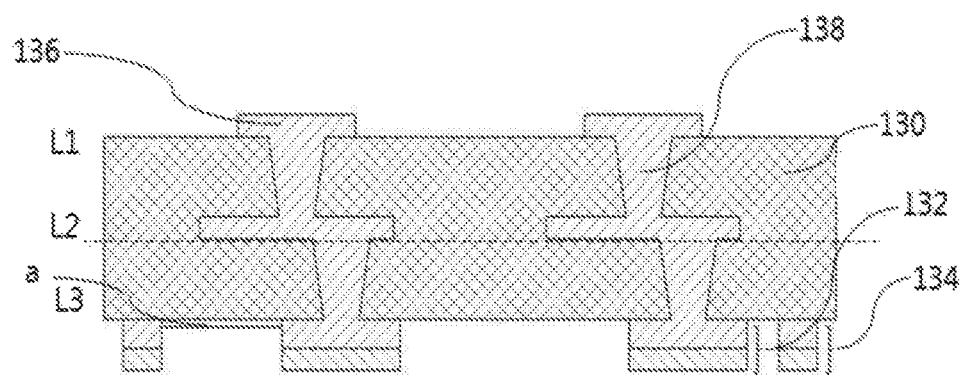
FIG. 4 is a cross-sectional view showing a printed circuit board, in which the position of a connection pad is changed.

FIG. 4 is a cross-sectional view showing a printed circuit board 140, in which the position of a connection pad 132 is changed.

As shown in FIG. 4, although the position of a connection pad 132 is changed, the substrate 100 may be connected to the pad 136 through the printed circuit board 140 configured of a plurality of thin copper layers. The pad 136 may be a pad for Surface Mount Technology (SMT).

Figure 5A:
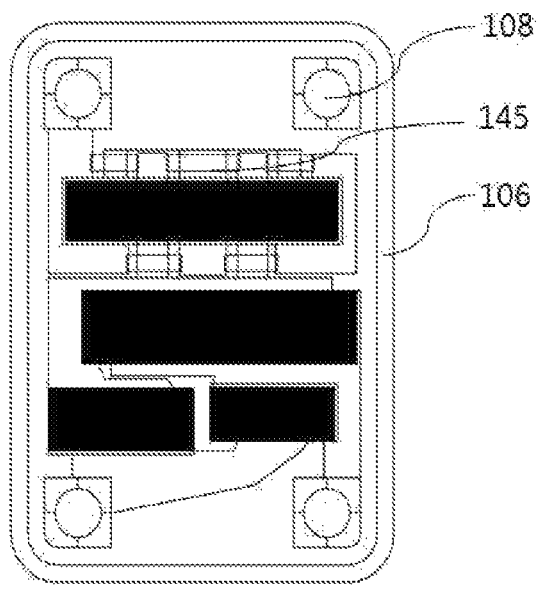
FIGS. 5A and 5B are plan views showing substrates according to the conventional invention and the present invention, respectively.
Figure 5B:
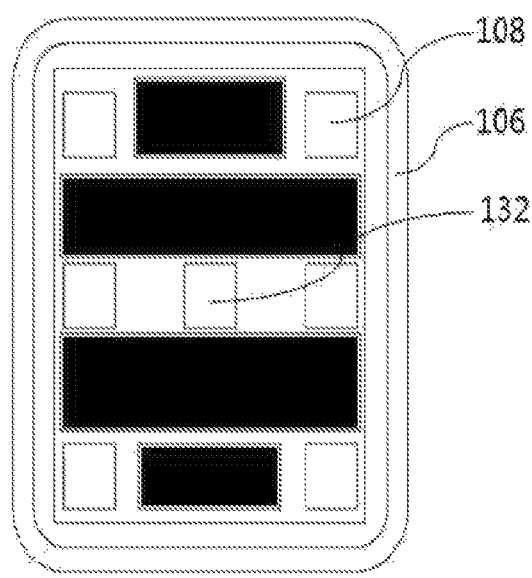

FIG. 5A is a plan view showing a conventional substrate 100, and FIG. 5B is a plan view showing a substrate 100 according to an embodiment of present invention.

Referring to FIGS. 5A and 5B, although the positions of the bonding pads 108 should be specified in the conventional substrate since SMT should be progressed after forming vias in the pad, in the wafer level package according to the present invention, the positions of the bonding pads 108 disposed on the substrate 100 do not need to be fixed to a specific position since the substrate 100 and the printed circuit board 140 are attached to each other and fixed to a module printed circuit board, and thus the bonding pads 108 and the circuit pattern units 104 may be freely disposed at any positions.

In addition, since the wafer level package according to the present invention may omit a bridge process since a bridge 145 needed for a wire design may be replaced with a ground terminal, a device can be miniaturized.

Accordingly, the wafer level package according to the present invention may improve freedom of design of the substrate 100 through the second thin copper layer L2, the third thin copper layer L3 and the via holes 138 since the position of the pad 136 does not need to be fixed.

Figure 6:
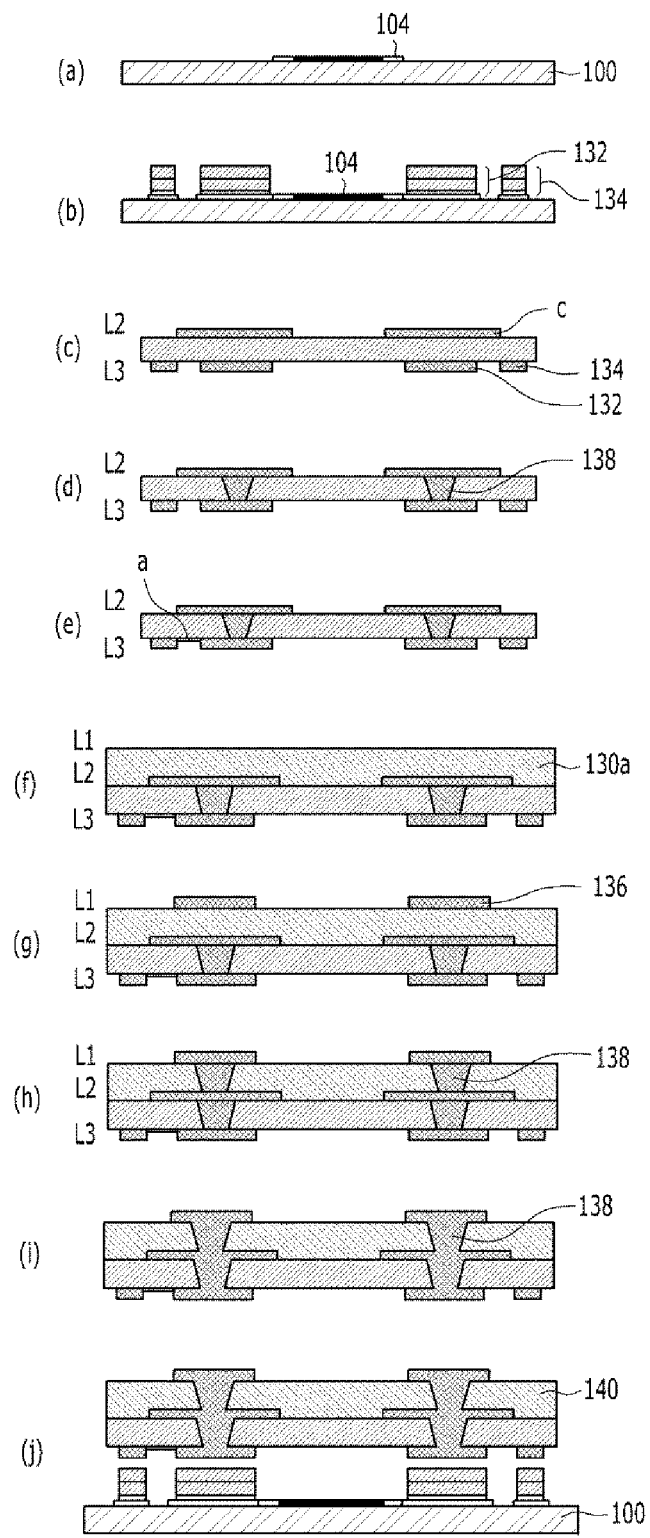
FIG. 6 is a view illustrating a method of manufacturing a wafer level package according to the present invention.

FIG. 6 is a view illustrating a method of manufacturing a wafer level package according to an embodiment of the present invention.

As shown in (a) and (b) of FIG. 6, a substrate 100 attached to the printed circuit board 140 may be designed first.

A plurality of circuit pattern units 104 is disposed on the substrate 100.

The circuit pattern unit 104 may be an Inter Digital Transducer (IDT) electrode unit. The circuit pattern unit 104 may be configured of conductive materials, and although the circuit pattern unit 104 may be implemented using materials having excellent electrical characteristics, such as copper (Cu), silver (Ag), palladium (Pd), aluminum (Al), nickel (Ni), titanium (Ti), gold (Au), platinum (Pt) and the like, it is not limited thereto.

Although the circuit pattern units 104 may be formed in a method such as Additive, Subtractive, semi-Additive or the like, it is not limited thereto.

A plurality of bonding pads 108 and a first protection dam 106 are disposed on a side of the substrate 100. The bonding pads 108 may be disposed to be spaced apart from the circuit pattern units 104, and the first protection dam 106 may be disposed along the edge of the substrate 100 to be spaced apart from the bonding pads 108. The bonding pads 108 are configured of conductive materials, and although the bonding pads 108 may be implemented using materials having excellent electrical characteristics, such as copper (Cu), silver (Ag), palladium (Pd), aluminum (Al), nickel (Ni), titanium (Ti), gold (Au), platinum (Pt) and the like, it is not limited thereto. The bonding pads 108 may have a single layer or stacked structure configured of conductive materials.

The first protection dam 106 is configured of conductive materials, and although the first protection dam 106 may be implemented using materials having excellent electrical characteristics, such as copper (Cu), silver (Ag), palladium (Pd), aluminum (Al), nickel (Ni), titanium (Ti), gold (Au), platinum (Pt) and the like, it is not limited thereto. The first protection dam 106 may have a single layer or stacked structure configured of conductive materials.

The first protection dam 106 may be implemented using conductive materials and a structure the same as those of the bonding pads 108.

The bonding pads 108 and the first protection dam 106 may be formed in a plating method, an evaporation method, a sputtering method or the like, it is not limited thereto.

As shown in (c) to (e) of FIG. 6, a plurality of connection pads 132 and a second protection dam 134 are disposed on a side of the second insulation layer 130b of the printed circuit board 140 at the positions corresponding to the bonding pads 108 and the first protection dam 106 of the substrate 100. The second protection dam 134 may be disposed along the edge of the printed circuit board 140 to be spaced apart from the connection pads 132.

The connection pads 132 of the printed circuit board 140 are configured of conductive materials, and although the connection pads 132 may be implemented using materials having excellent electrical characteristics, such as copper (Cu), silver (Ag), palladium (Pd), aluminum (Al), nickel (Ni), titanium (Ti), gold (Au), platinum (Pt), tin (Sn) and the like, it is not limited thereto.

The second protection dam 134 of the printed circuit board 140 is configured of conductive materials, and although the second protection dam 134 may be implemented using materials having excellent electrical characteristics, such as copper (Cu), silver (Ag), palladium (Pd), aluminum (Al), nickel (Ni), titanium (Ti), gold (Au), platinum (Pt), tin (Sn) and the like, it is not limited thereto.

The bonding pads 108 and the second protection dam 134 may have a single layer or stacked structure configured of conductive materials.

Although the second protection dam 134 may be implemented using conductive materials and a structure the same as those of the connection pads 132, it is not limited thereto.

A second circuit pattern layer 'c' may be disposed on the top of the second insulation layer 130b.

Via holes 138 may be formed to pass through the second insulation layer 130b from the connection pads 132 and the second protection dam 134 of the printed circuit board 140 and to be connected to the second circuit pattern layer 'c'.

After the via holes 138 are formed, inside of the via holes 138 is filled with a conductive material such as copper (Cu), gold (Au) or the like, and although the method of filling a conductive material includes a plating method, a conductive paste filling method and the like, it is not limited thereto.

A connection unit 'a' connected to the second protection dam 134 and some of the connection pads 132 may be disposed. The connection pads 132 connected to the second protection dam 134 through the connection unit 'a' may be a ground (GND) pad. The connection unit 'a' may be configured of a Cu single layer, an Sn single layer, a Cu/Sn dual layer or the like and may be implemented through an electroless or electroplating method.

As shown in (f) to (i) of FIG. 6, a pad 136 for Surface Mount Technology (SMT) is formed at a specific position on the top of the first insulation layer 130a.

The first insulation layer 130a may be disposed on a side of the second insulation layer 130b.

A first circuit pattern layer (not shown) may be formed on a side of the first insulation layer 130a.

Via holes 138 may be formed to pass through the first insulation layer 130a so that the second circuit pattern layer 'c' and the first circuit pattern layer may be electrically connected.

After the via holes 138 are formed, inside of the via holes 138 is filled with a conductive material such as copper (Cu), gold (Au) or the like, and although the method of filling a conductive material includes a plating method, a conductive paste filling method and the like, it is not limited thereto.

As shown in (j) of FIG. 6, the substrate 100 and the printed circuit board 140 are attached to each other.

The substrate 100 and the printed circuit board 140 may be attached through the bonding pads 108 and the first protection dam 106 of the substrate 100 and the connection pads 132 and the second protection dam 134 of the printed circuit board 140.

The substrate 100 and the printed circuit board 140 may be TLP-bonded through an appropriate level of temperature, pressure and vacuum level.

Conditions for the TLP bonding includes temperature, pressure and vacuum level, and the temperature is 230 to 350 degrees, the pressure is 100 kgf to 2000 kgf, and the vacuum level is the atmospheric pressure to torr.

The conditions of temperature, pressure and vacuum level state conditions of the present invention for conducting TLP bonding, and they are not limited thereto.

Figure 7:
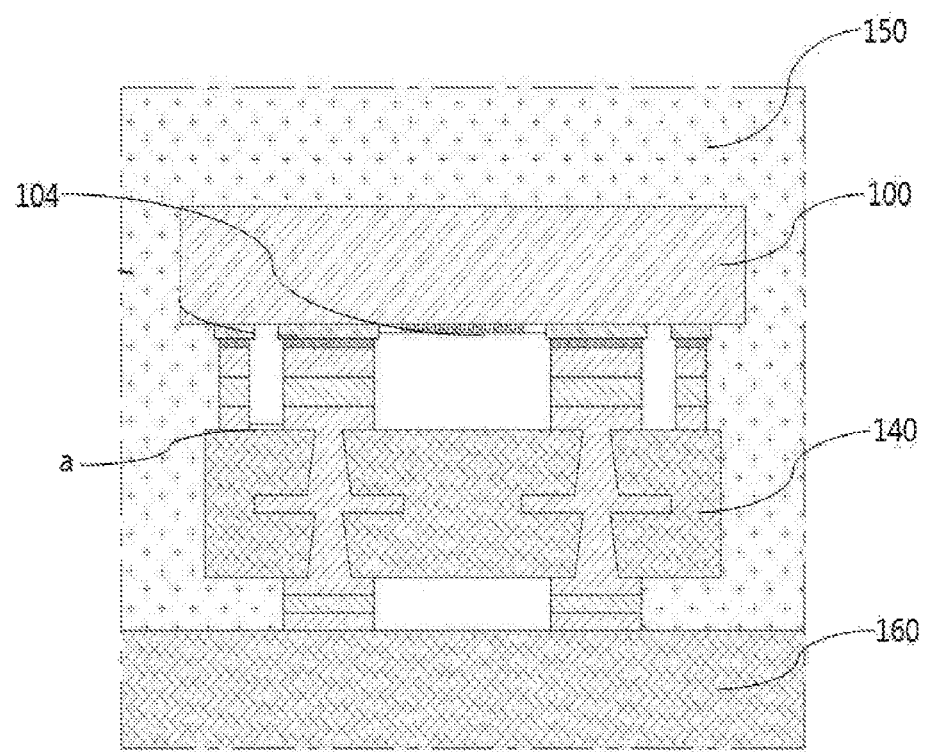
FIG. 7 is a cross-sectional view showing a module in which a wafer level package according to the present invention is installed on a module printed circuit board.

FIG. 7 is a cross-sectional view showing a module in which a wafer level package according to an embodiment of the present invention is installed on a module printed circuit board.

As shown in FIG. 7, a module may be manufactured by disposing a wafer level package on a module printed circuit board 160 and covering the wafer level package with an insulation wrapping member 150.

Particularly, a memory module printed circuit board is a printed circuit board modularized after installing a plurality of memory semiconductor device packages on the surface and may expand DRAM capacity within a PC or a server according to application fields.

The memory module printed circuit board performs a function of extending memory capacity or data input and output.

Freedom of design can be improved through the wafer level package and the manufacturing method thereof according to the present invention.

In addition, reliability of the wafer level package can be improved, through the present invention.

In addition, the manufacturing process can be simplified as the bridge process is omitted when wiring is designed, through the present invention.

In addition, the size of an element may be reduced, through the present invention.

Although the present invention has been described above, those skilled in the art may recognize that the present invention may be implemented in other forms while maintaining the technical spirit and essential features of the present invention.

Although the scope of the present invention will be defined by the claims, it is to be interpreted that the configurations directly derived from the claims and all the changes or modified forms derived from the equivalent configurations thereof also fall within the scope of the present invention.

What is claimed is:

1. A wafer level package comprising:
a substrate including bonding pads and a first protection dam and having a plurality of circuit pattern units disposed on a side, wherein the bonding pads and the first protection dam are formed to be protruded from the side of the substrate;
a printed circuit board having an insulation layer comprised of a first insulation layer and a second insulation layer, a plurality of connection pads, a second protection dam and via holes disposed thereon,
wherein a first thin copper layer is formed on a surface of the first insulation layer, a second thin copper layer is formed between another surface of the first insulation layer and a surface of the second insulation layer, and a third thin copper layer is formed on another surface of the second insulation layer, and
wherein the via holes passing through the first insulation layer and the second insulation layer are formed at positions corresponding to the bonding pads, and wherein the connection pads and the second protection dam are formed to be protruded from the other surface of the second insulation layer; and
a connection unit connected to a part of the plurality of connection pads and the second protection dam disposed on the printed circuit board,
wherein the connection pads and the second protection dam are disposed on the printed circuit board at positions corresponding to the bonding pads and the first protection dam disposed on the substrate, and
wherein the substrate and the printed circuit board are attached to each other by bonding the bonding pads and the first protection dam disposed on the substrate to the connection pads and the second protection dam disposed on the printed circuit board.

2. The package according to claim 1, wherein the connection pads connected to the second protection dam through the connection unit are a ground pad.

3. The package according to claim 1, wherein a pad for SMT is disposed on a side of the printed circuit board.

4. The package according to claim 1, wherein the connection pads are implemented as a single layer or multiple layers of conductive materials.

5. The package according to claim 1, wherein the first protection dam and the second protection dam are implemented using material and a structure the same as those of the connection pads.

6. The package according to claim 1, wherein when the bonding pads and the connection pads, and the first protection dam and the second protection dam are attached or coupled, an overall structure is Cu—Sn—Cu or Au—Sn—Au.

7. The package according to claim 6, wherein if the overall structure is Cu—Sn—Cu when the bonding pads and the connection pads, and the first protection dam and the second protection dam are attached or coupled, the connection pads and the second protection dam are configured as a Cu single layer structure if the bonding pads and the first protection dam are a Cu—Sn stack structure, and the connection pads and the second protection dam are configured as an Sn—Cu stack structure if the bonding pads and the first protection dam are a Cu single layer structure.

8. The package according to claim 6, wherein if the overall structure is Au—Sn—Au when the bonding pads and the connection pads, and the first protection dam and the second protection dam are attached or coupled, the connection pads and the second protection dam are configured as an Au single layer structure if the bonding pads and the first protection dam are an Au—Sn stack structure, and the connection pads and the second protection dam are configured as an Sn—Au stack structure if the bonding pads and the first protection dam are an Au single layer structure.

9. A method of manufacturing a wafer level package, the method comprising the steps of:
manufacturing a substrate;
manufacturing a printed circuit board; and
attaching the substrate and the printed circuit board to each other,
wherein the step of manufacturing the substrate includes:
disposing circuit pattern units on a substrate;
disposing bonding pads and a first protection dam on a side of the substrate, wherein the bonding pads and the first protection dam are formed to be protruded from the side of the substrate;
wherein the step of manufacturing the printed circuit board includes:
disposing connection pads and a second protection dam on a side of a second insulation layer of the printed circuit board, wherein the connection pads and the second protection dam are formed to be protruded from the side of the second insulation layer;
forming a second circuit pattern layer on another side of the second insulation layer;
forming via holes passing through the second insulation layer from the connection pads and being connected to the second circuit pattern layer;
disposing a connection unit for connecting the second protection dam and a part of the connection pads;
disposing a first insulation layer on the other side of the second insulation layer;
disposing a first circuit pattern layer and a pad on a side of the first insulation layer;
forming via holes passing through the first insulation layer from the first circuit pattern layer and being connected to the second circuit pattern layer; and
filling inside of the via holes,
wherein the connection pads and the second protection dam are disposed on the printed circuit board at positions corresponding to the bonding pads and the first protection dam disposed on the substrate, and
wherein the step of attaching the substrate and the printed circuit board includes a step of bonding the bonding pads and the first protection dam disposed on the substrate to the connection pads and the second protection dam disposed on the printed circuit board.

10. The method according to claim 9, wherein the connection pads connected to the second protection dam through the connection unit are a ground pad.

11. The method according to claim 9, wherein the connection pads and the second protection dam of the printed circuit board are disposed at positions corresponding to the bonding pads and the first protection dam disposed on the substrate.

12. The method according to claim 9, wherein the connection pads are implemented as a single layer or multiple layers of conductive materials.

13. The method according to claim 9, wherein the second protection dam is implemented using conductive materials and a structure the same as those of the connection pads.

14. The method according to claim 9, wherein the pad is a pad for SMT.

15. The method according to claim 9, wherein at the step of attaching the substrate and the printed circuit board, the bonding pads and the connection pads, and the first protection dam and the second protection dam may be attached, and an overall structure when they are attached is Cu—Sn—Cu or Au—Sn—Au.

16. The method according to claim 15, wherein if the overall structure is Cu—Sn—Cu when the bonding pads and the connection pads, and the first protection dam and the second protection dam are attached, the connection pads and the second protection dam are configured as a Cu single layer structure if the bonding pads and the first protection dam are a Cu—Sn stack structure, and the connection pads and the second protection dam are configured as an Sn—Cu stack structure if the bonding pads and the first protection dam are a Cu single layer structure.

17. The method according to claim 15, wherein if the overall structure is Au—Sn—Au when the bonding pads and the connection pads, and the first protection dam and the second protection dam are attached, the connection pads and the second protection dam are configured as an Au single layer structure if the bonding pads and the first protection dam are an Au—Sn stack structure, and the connection pads and the second protection dam are configured as an Sn—Au stack structure if the bonding pads and the first protection dam are an Au single layer structure.

* * * * *